(12) United States Patent
Lee

(10) Patent No.: US 8,853,008 B1
(45) Date of Patent: Oct. 7, 2014

(54) COUNTER-DOPED LOW-POWER FINFET

(71) Applicant: Intermolecular, Inc., San Jose, CA (US)

(72) Inventor: Mankoo Lee, Fremont, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/871,270

(22) Filed: Jul. 15, 2013

Related U.S. Application Data

(60) Provisional application No. 61/783,294, filed on Mar. 14, 2013.

(51) Int. Cl.
*H01L 21/332* (2006.01)
*H01L 29/76* (2006.01)
*H01L 21/265* (2006.01)
*H01L 29/78* (2006.01)
*H01L 29/66* (2006.01)

(52) U.S. Cl.
CPC ............ *H01L 21/265* (2013.01); *H01L 29/785* (2013.01); *H01L 29/66803* (2013.01)
USPC .................... 438/135; 257/288; 257/E21.421; 257/E29.255

(58) Field of Classification Search
USPC ........... 257/288, E21.421, E29.255; 438/135, 438/186, 197–202, 289
See application file for complete search history.

(56) References Cited

U.S. PATENT DOCUMENTS 8,580,643 B2 * 11/2013 Baldauf et al. ................ 438/289

OTHER PUBLICATIONS

Auth et al.; A 22nm High Performance and Low-Power CMOS Technology Featuring Fully-Depleted Tri-Gate Transistors, Self-Aligned Contacts and High Density MIM Capacitors; 2012; IEEE; 2012 Symposium on VLSI Technology Digest of Technical Papers; pp. 131-132.
Bohr; The Evolution of Scaling From the Homogeneous Era to the Heterogeneous Era; 2011; IEEE; pp. 1.1.1-1.1.6.
Ang et al.; 300mm FinFET Results Utilizing Conformal, Damage Free, Ultra Shallow Junctions (Xj~5nm) Formed with Molecular Monolayer Doping Technique ; 2011; IEEE; pp. 35.5.1-35.5.4.
I. Ok et al.; Conformal, Low-damage Shallow Junction Technology (Xj~5nm) with optimized contacts for FinFETs as a Solution Beyond 14nm Node; 2012; IEEE; 6 pages.
Horiguchi et al.; Junction Strategies for 1x nm Technology Node with FinFET and High Mobility Channel; 2012; IEEE; 6 pages.

\* cited by examiner

*Primary Examiner* — S. V. Clark
*Assistant Examiner* — Monica D Harrison

(57) ABSTRACT

FinFETs and methods for making FinFETs are disclosed. A fin is formed on a substrate, wherein the fin has a height greater than 2 to 6 times of its width, a length defining a channel between source and drain ends, and the fin comprises a lightly doped semiconductor. A conformally doped region of counter-doped semiconductor is formed on the fin using methods such as monolayer doping, sacrificial oxide doping, or low energy plasma doping. Halo-doped regions are formed by angled ion implantation. The halo-doped regions are disposed in the lower portion of the source and drain and adjacent to the fin. Energy band barrier regions can be formed at the edges of the halo-doped regions by angled ion implantation.

18 Claims, 6 Drawing Sheets

COUNTER-DOPED LOW-POWER FINFET

CROSS-REFERENCE TO RELATED APPLICATIONS

This application claims priority from U.S. Provisional Patent Application Ser. No. 61/783,294, filed Mar. 14, 2013, the contents of which are incorporated by reference.

FIELD OF THE INVENTION

One or more embodiments of the present invention relate to methods of manufacture of semiconductor devices.

BACKGROUND

Halo implant methods have been used to improve a short channel effect (SCE) in planar field effect transistors ("FETs"). Typically, an angled halo ion implantation with dopants of opposite polarity from that of the source and drain regions is used to increase the substrate doping adjacent to the source and drain regions of an FET in a way that effectively reduces the extent of the source and drain at the edges and/or under the sidewall spacers but at some depth below the semiconductor substrate surface.

Compared to the most advanced planar FET devices, a fin-shaped field effect transistor ("FinFET") provides lower power due to the fully depleted (lightly doped) thin body of the fin and the resulting reduced or reverse SCE with improved drain-induced barrier lowering (DIBL). A FinFET generally has a lightly doped channel and less random dopant fluctuation (RDF) than a planar FET.

Low power is increasingly important as device size decreases, particularly for radio frequency (RF) analog circuit design and system-on-chip (SoC) applications, because most RF/analog transistors tend to operate in the saturation region for a higher transconductance. However, as yet, FinFETs for analog applications have not been fully optimized for low power operation.

Auth et al. ("A 22 nm high performance and low-power CMOS technology featuring fully-depleted tri-gate transistors, self-aligned contacts and high density MIM capacitors," *IEEE Symposium on VSLI Technology*, 131-32, 2012, incorporated herein by reference) disclose performance parameters for Intel's tri-gate transistor technology now in volume production. Neither these FinFETs nor others in development take advantage of halo or super-halo implants to improve performance. Super-halo methods have so far been used only in planar FETs, as discussed, for example, in Liu et al. ("Fluorine-assisted super-halo for sub-50 nm transistor," *IEEE Electron Device Letters*, 24 (3), 180-82, 2003 incorporated herein by reference).

SUMMARY OF THE INVENTION

Methods for making a FinFET are disclosed. A fin is formed on a substrate, wherein the fin has a height between two and six times its width, and a length defining a channel between source and drain ends. The fin comprises a lightly doped semiconductor. A conformal region of counter-doped semiconductor is formed on the surface of the fin. Halo-doped regions are formed by angled ion implantation. The halo-doped regions are disposed in the lower portion of the source and drain and adjacent to the fin. Energy band barriers can be formed at the edges of the halo-doped regions by angled ion implantation.

In some embodiments, the conformal region of counter-doped semiconductor is formed by wet chemical doping method using a molecular monolayer deposition (MLD) process. A solution comprising the dopant molecules is applied to the fin surface. A sacrificial oxide layer is added, to encapsulates the fin surface with dopant. The dopant atoms can be made to migrate into the surface of the fin by performing a rapid thermal annealing (RTA) at about 950-1150° C. The oxide layer can be removed after annealing.

In some embodiments the conformal region of counter-doped semiconductor is formed by exposing the fin surface to a plasma comprising dopant atoms.

In some embodiments the conformal region of counter-doped semiconductor can be formed by forming a conformal oxide layer comprising dopant atoms on the fin surface. The dopant atoms can be made to migrate into the surface of the fin by performing a rapid thermal annealing (RTA) at about 950-1150° C. The oxide layer can be removed after annealing.

Novel FinFET devices are disclosed having a fin on a substrate, the fin having a height of 2 to 6 times of its width, and a length defining a channel between source and drain ends. The fin comprises a lightly doped conductor. A conformal counter-doped region is disposed on the top and sides of the fin. Halo-doped regions are disposed in the lower portion of the source and drain and adjacent to the sidewall spacers on the fin.

Band barriers can be disposed at the edges of the halo-doped regions. The band barriers can comprise barrier atoms comprising halo-implant dopants (p- or n-type dopants) with fluorine for point defect reduction as well as to provide a barrier against dopant migration.

The lightly doped semiconductor can be n-doped, with the counter-doped region p-doped, and the halo-doped regions n-doped for a low power p-channel FinFET. Alternatively, the lightly doped semiconductor can be p-doped, with the counter-doped semiconductor n-doped, and the halo-doped regions p-doped for a low power n-channel FinFET. The lightly doped semiconductor can comprise Si bulk or SOI fins. The semiconductor used for the source and drain connections can comprise p-doped SiGe for p-type FinFETs, where the Ge fraction is greater than 50% by atomic fraction for achieving a maximum channel strain effect.

DETAILED DESCRIPTION

Before the present invention is described in detail, it is to be understood that unless otherwise indicated this invention is not limited to specific semiconductor devices or to specific semiconductor materials. Exemplary embodiments will be described for three-dimensional transistors such as FinFETs made on silicon substrates, but other devices can also be fabricated using the methods disclosed. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limits of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" is used, the two quantities may vary from each other by no more than 5%.

DEFINITIONS

Figure 3:
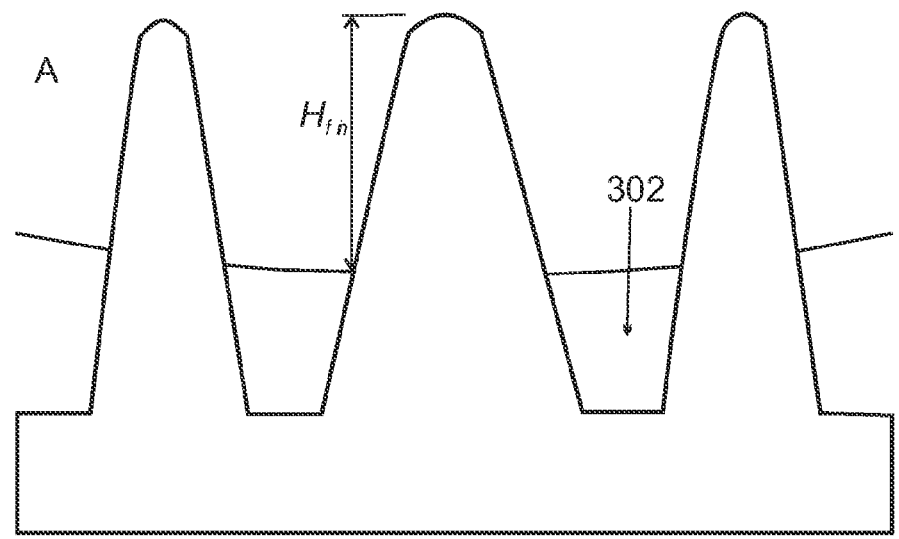
FIG. 3 shows fin shape, height, and angle ( ) determination for tri-gate transistors.
Figure 3:
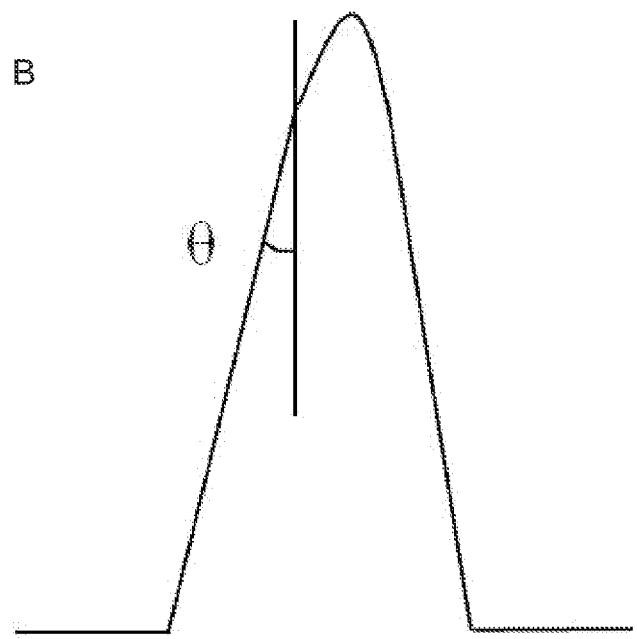

The term "FinFET" as used herein refers to a fin-shaped field effect transistor, typically having feature sizes of less than 28 nm, which includes a semiconductor "fin" that extends the semiconductor region between the source and drain above the semiconductor substrate. Fins have a high aspect ratio wherein the height of the fin is 2 to 6 times the width (e.g., fin width=8 nm and fin height=32 nm for 16 nm node bulk-FinFETs), although the aspect ratio can vary depending on processes. The length of the fin is characterized by both a "gate length" defined by the extent of the gate electrode along the long direction of the fin and an "extension length" which comprises additional fin length beyond the gate length toward the source and drain. Typical gate lengths are of similar magnitude to the fin height. FinFETs can also include tri-gate FETs with an angle θ defined as shown in FIG. 3.

The term "sidewall spacer" refers to an insulating structure adjacent to either end of the gate electrode. Sidewall spacers electrically separate the gate electrode from the source and drain electrodes. For a gate that covers the sides and top of the fin, the sidewall spacers similarly contact the sides and top of the fin. In a typical manufacturing process sequence, after the fin is formed, a "dummy" gate electrode is formed, for example, from polycrystalline silicon. The sidewall spacers are formed adjacent to the dummy gate electrode. The dummy gate electrode is then removed (etched away), and the actual gate electrode (e.g., metal or metal nitride) is formed between the sidewall spacers.

The term "lightly doped" as used herein refers to semiconductor doping levels that are lower than that typically used in most device applications. Typical levels of doping for "lightly doped" semiconductors are 1 to $5 \times 10^{15}$ dopant atoms/cm$^3$. However, the doping level can be higher as the channel length is increased.

The present invention discloses methods of making ultra-low-power FinFETs. The methods adapt the concepts used in the super-halo implant methods used with planar FETs to the requirements of the three-dimensional structure of a FinFET by using novel processing steps to achieve similar device performance goals. The designs enable higher threshold voltage ($V_t$) and lower off current ($I_{off}$) while maintaining a high $I_{ds\,sat}$ (or equivalent effective $I_{ds}$ logic operation current.)

Figure 1:
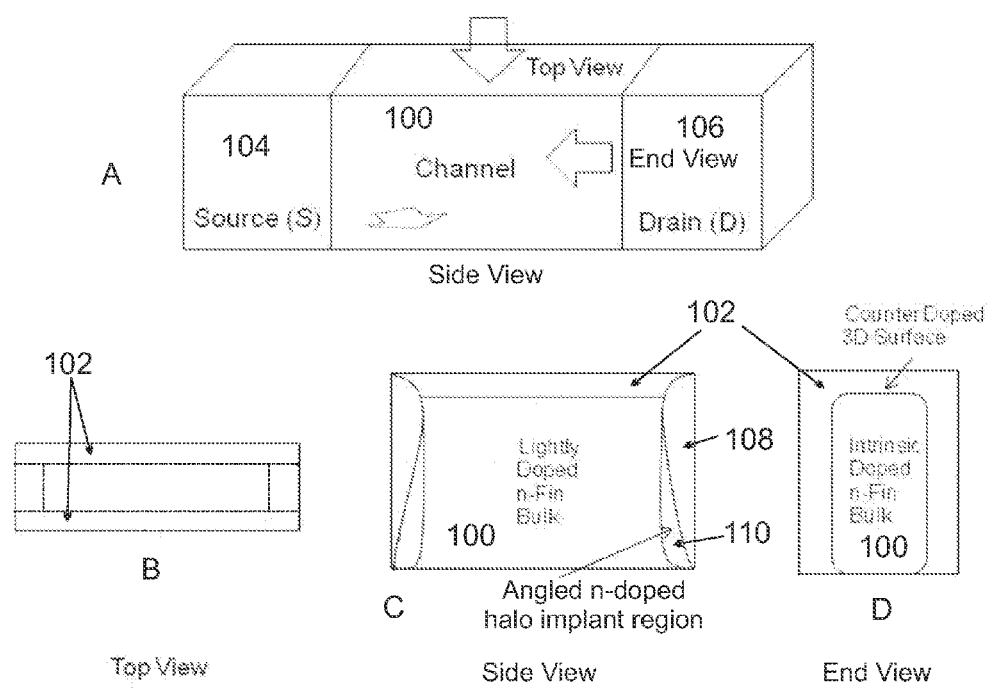
FIG. 1 shows three-dimensional and plan views of a FinFET fin constructed according to some embodiments (FIG. 1A: all views.
Figure 1E:
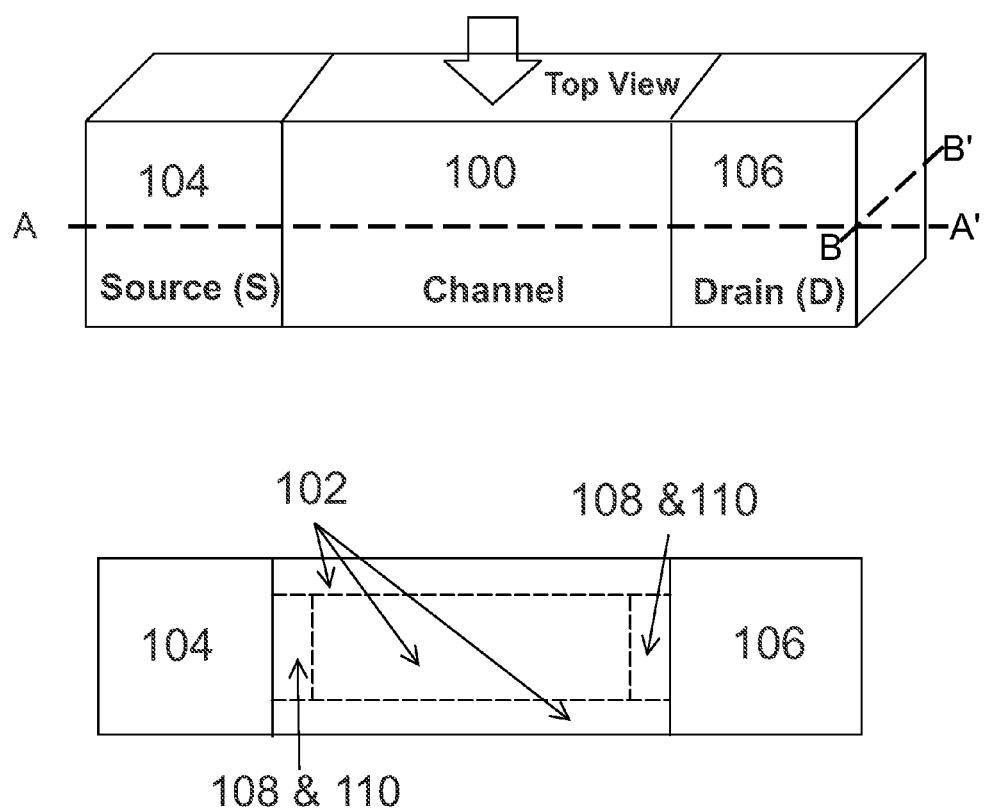
FIGS. 1B&E: top view.
FIGS. 1C&F: side view.
FIGS. 1D&G: end view).
Figure 1F:
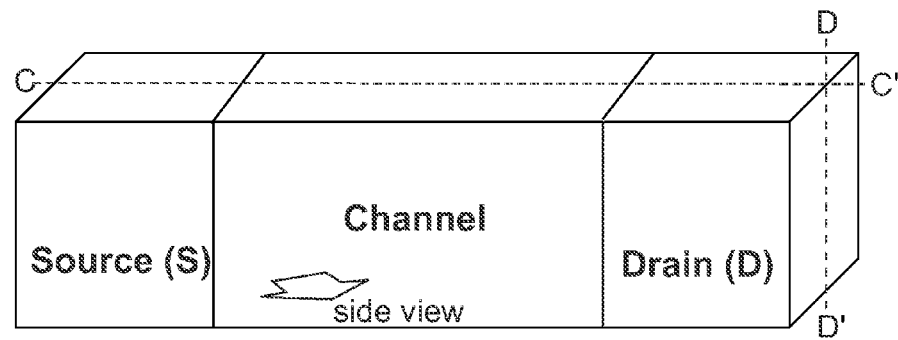
Figure 1F:
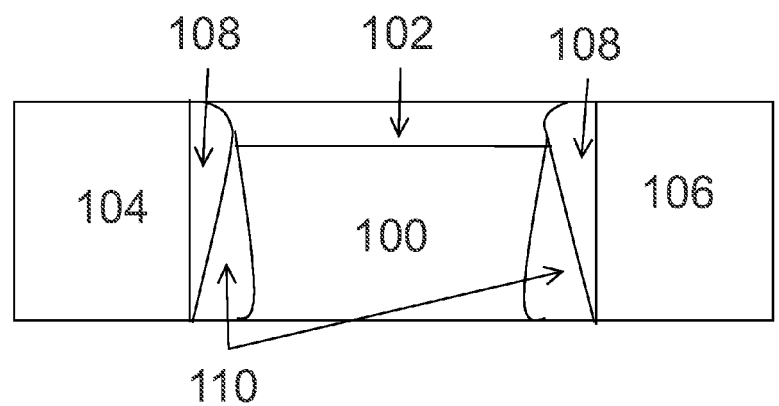
Figure 1G:
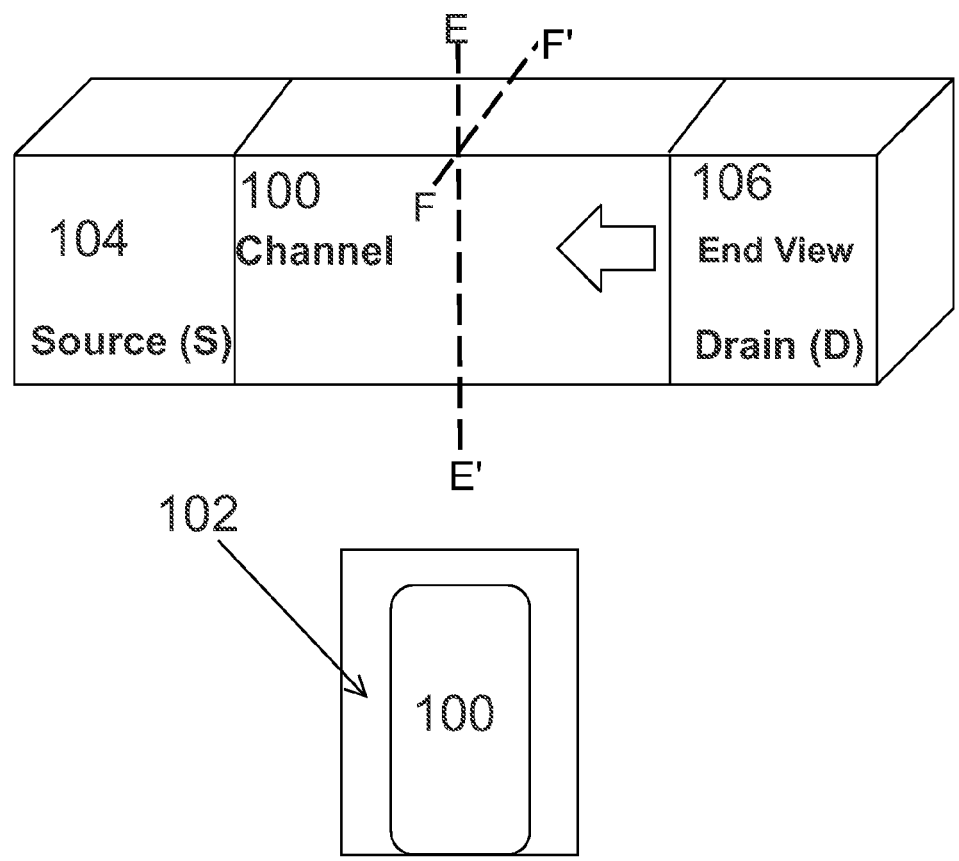

Embodiments will be described for p-type FinFETs, although one of skill in the art will recognize that n-type devices can also be made. FIG. 1A shows a three-dimensional rendering. Three plan views of a fin (comprising, for example, Si) for a FinFET are also provided. FIGS. 1B and 1E show a top view. FIGS. 1C and 1F show a side view. FIGS. 1D and 1G show an end view. In FIG. 1E the cross section shown is for the plane defined by the lines AA' and BB'. In FIG. 1F the cross section shown is for the plane defined by the lines CC' and DD'. In FIG. 1G the cross section shown is for the plane defined by the lines EE' and FF'.

In some embodiments, a lightly n-doped fin 100 is formed. Fin 100 has a height 2 to 6 times its width, and has two ends, with electrical connection to source 104 and drain 106 which are positioned opposite each end of the fin 100. The fin 100 also has a top and two sides, as shown in FIGS. 1A-1D. The fin serves as a "channel" between the source 104 and drain 106. The source (S) 104 and drain (D) 106 comprise p-doped SiGe having Ge>50 atomic %. SiGe is a common choice, because it can induce effective compressive channel stress due to lattice mismatch with substrate Si atoms, and a lower junction barrier height that can be caused by a lower energy band gap ($E_g$) of SiGe compared to Si. Also SiGe can be heavily doped to provide low-resistance connections by using selective epitaxial growth. One of ordinary skill will recognize that many other semiconductor materials can be used in source 104 and drain 106 by using lattice mismatch of composite atoms to create stress in the channel.

A counter-doped (p-doped) region 102 of a few nanometers (e.g., 1-3 nm) thickness is formed on the top and sides of the fin 100 as illustrated in FIGS. 1B, 1D, 1E, and 1G. The counter-doped region 102 forms a net neutral ("zero-doped") surface channel near the high-κ gate dielectric layer (not shown) which surrounds fin 100, except for the portion underneath the fin which is in contact with the substrate, as shown in the FIGS. 1D and 1G. The resulting doping profile (low at the edge—high at the center—low at the edge) yields a low bulk depletion capacitance and lowers the sub-threshold slope of the drain current vs. gate voltage curve. Retrograde well formation is not as easily achieved inside such a thin fin by ion implantation as can be implemented in a planar FET. Instead, a counter doping method can be used. The counter doping creates a relatively higher doping region in the center of the fin compared to the zero doping at the channel surfaces. This counter doping creates a larger depletion depth from the channel edge to the channel center for lower depletion capacitance. The lower depletion capacitance reduces a sub-threshold slope that in turn suppresses channel leakage (or channel off) current.

In some embodiments, the FinFET includes angled halo implants 110 (e.g., n-type dopant atoms such as P atoms) formed in the SiGe material of the source and drain adjacent to the ends of the lightly n-doped fin 100. The implant region can be located in the lower part of the channel side of the SiGe p-doped region 108, i.e., adjacent to the lower portion of the ends of the fin after the sidewall spacers are formed on the fin, as shown in FIGS. 1B, 1C, 1E, and 1F. The angled halo implants can be formed by setting the angle for implantation to ~35-40 degrees. Forming diamond-shaped raised S/D regions can provide a deeper set of in situ boron doped SiGe epitaxial S/D. The diamond-shaped S/D regions results in lower contact resistance and maximum channel strain. In addition, a round-shaped embedded SiGe with undercut inside the fin from the S/D ends can reduce the parasitic resistances that exist under the sidewall layers and increases channel strain effectively. The halo-implanted region has the effect of raising the source and drain conduction band barrier height by extending the fin semiconductor into the lower part of the source and drain connections to the fin as shown in FIGS. 1C and 1F. This extension can raise threshold voltage ($V_t$) for a reverse SCE.

In some embodiments, additional halo implants using fluorine atoms can be formed using low energy ion implantation to create band barriers at the edges of the angled halo implants 110. The band barriers can prevent bulk point defects and passivate the halo region to prevent atomic migration. The band barriers (not shown in the figures) can be created by halo implantation with a dopant of opposite polarity from that of the S/D regions together with a passivation atom such as fluorine. The band barriers can function as diffusion barriers and do not themselves function as either p- or n-type electrical dopants. The halo implant ion energy, angle, and a number of ion implants can be adjusted to place these barrier atoms at a desired boundary for the halo-doped region thereby confining the dopant atoms to a well-defined region during any subsequent annealing. In a typical ion implantation apparatus, a single ion beam is available, and the wafer can be positioned and rotated to direct the ion beam to the desired locations.

In some embodiments, the polarity of doping is reversed. For example, a lightly p-doped fin can be formed, having a height of 2-6 times its width, and two ends, with electrical connection to source and drain semiconductor components which are positioned opposite each end of the fin. The fin serves as a "channel" between the source and drain. The source and drain comprise n-doped S/D for n-channel FinFET. A counter-doped (n-doped) region of a few nanometers thickness is formed on the top and sides of the fin. The counter-doped region forms a net neutral ("zero-doped") surface channel near the high-ic gate dielectric layer (not shown) which surrounds the fin. The resulting doping profile (low at the edge—high at the center—low at the edge) yields a low bulk depletion capacitance and lowers the sub-threshold slope of the drain current vs. gate voltage curve. In addition, angled halo implants (e.g., p-type dopant atoms such as B atoms) can be formed in the material of the source and drain adjacent to the ends of the lightly n-doped fin. The implant region can be located in the lower part of the channel side of the p-doped region 108, i.e., adjacent to the lower portion of the ends of the fin after the sidewall spacers are formed on the fin.

Figure 2:
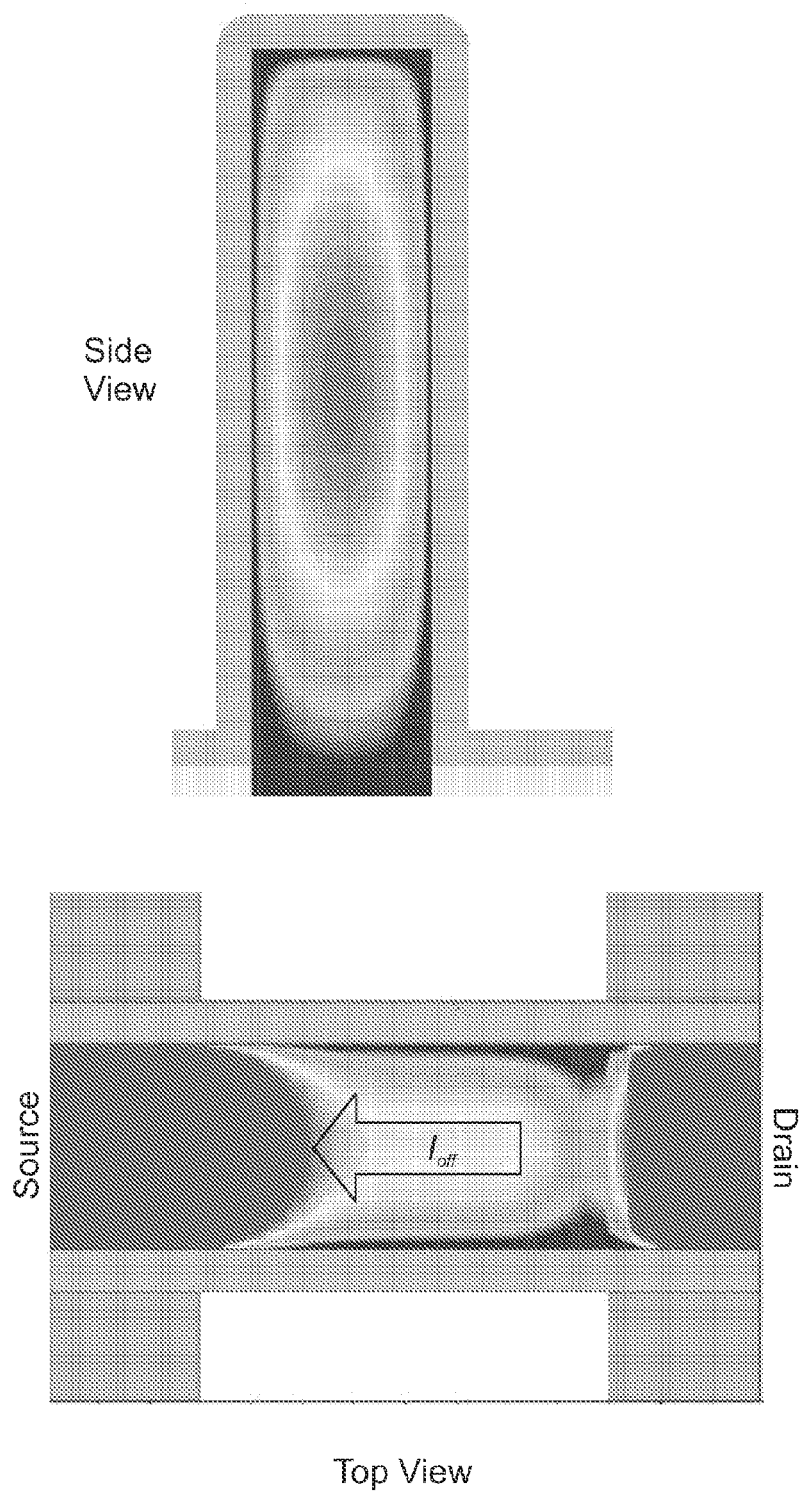
FIG. 2 shows a TCAD simulation of the off-current density in a p-channel FinFET.

FIG. 2 shows a TCAD (Technology Computer Aided Design) simulation example using Sentaurus tools (all available from Synopsis, Inc., Mountain View Calif.) for a lightly doped fin with a counter-doped layer according to some embodiments of a p-type FinFET. It can be seen that most $I_{off}$ current flows through the center of the fin body (Top View). However, $I_{on}$ current (not shown) normally flows through the fin surface when the channel inversion layer is formed. Although an anti-punch-through (APT) implant might be useful for an extremely short channel FinFET, it would be difficult to directly apply a high dose APT implant into the fin body for prevention of possible fin amorphization. Therefore, in some embodiments, the fin can be modified such that in addition to the intrinsic fin body doping at the channel (fin) surfaces, counter doping with an opposite polarity dopant is provided to form a low-high-low doping profile.

FIG. 3 shows the shape and height of a fin for a tri-gate FinFET, and defines a fin angle (in FIG. 3B) characterizing the slope of the sidewalls of the fin. As becomes greater, the FinFET exhibits greater $I_{off}$ and more leakage. For example, a planar bulk FET having =90° exhibits more leakage than a FinFET, because the channel cannot be fully depleted, while an ideal FinFET having =0° exhibits the least leakage. In the tri-gate fin design, reduction in the angle θ can also lead to reduced $I_{off}$. Accordingly, embodiments of the present invention include FinFETs having a fin angle of from 6 to 10°. FIG. 3A also illustrates the definition of fin height $H_{fin}$ in the presence of shallow trench isolation (STI) 302. In some embodiments, the fins are initially formed with a greater height that is effectively reduced by etching back a dielectric material (the STI) to determine the actual fin height. The remaining STI partially fills the space for device isolation purposes between fins prior to formation of gate oxide and electrode layers.

In some embodiments, the counter doping can be achieved using wet chemical doping methods. Monolayer doping (MLD) methods are described for achieving a very steep S/D junction profile, for example, in Ang et al., ("300 mm FinFET Results Utilizing Conformal, Damage Free, Ultra Shallow Junctions ($X_j$~5 nm) Formed with Molecular Monolayer Doping Technique," *IEEE Int. Electron Devices Meeting*, 837-40, 2011 incorporated herein by reference). In embodiments of the instant invention, monolayer doping can be used for channel counter doping. Briefly, a self-assembled monolayer (SAM) containing dopant atoms is conformally applied to the fin surface, and then the fin and SAM are subsequently heated. The heating results in the breakage of the molecular structures of the SAM and causes the dopant atoms to migrate into the surface of the fin. In some embodiments, an oxide capping layer is deposited over the SAM, and RTA at 950-1150° C. causes the SAM to break and the dopant atoms to migrate into the fin. The oxide is then removed by etching to leave the original fin, now with a counter-doped region near the surface.

For example, MLD can start with hydrogen-terminated or hydride-based passivation on silicon surfaces (e.g., prepared by etching with 0.5% HF). The surface can be reacted with the functional group (e.g., allyl or vinyl) of a dopant molecule (see e.g., Ho, J. C., et al. "Controlled nanoscale doping of semiconductors via molecular monolayers," *Nature Materials* 7, 62, 2008, incorporated herein by reference). Suitable dopant molecules (precursors) for forming dopant-containing SAMs include, for example, allylboronic acid pinacol ester (a boron containing precursor), trioctylphosphine or diethyl 1-propylphosphonate (phosphorous containing precursors). The precursors can be applied to the fin dissolved in a suitable solvent, i.e., a solvent in which the precursors are soluble at the desired concentration, and which does not interfere with or compete with the functional group of the precursor for reaction at the semiconductor surface. Typical solvents include mesitylene.

In some embodiments, the wet chemical doping can be omitted, and the dopant molecules can be provided in a sacrificial oxide layer applied conformally to the fin surface. This oxide layer is similar to the capping layer applied for embodiments of MLD. For example, phosphosilicate glass (PSG) and borosilicate glass (BSG) can be used as dopant sources. After the dopants diffuse into the fin, the glass can be etched away. For example, ALD can be used to deposit glass layers having precisely controlled thickness and dopant composition. Subsequent RTA to temperatures of 950-1150° C. (for PSG and BSG layers) can allow the dopant atoms to migrate into the fin, after which the oxide layer can be etched away leaving a counter-doped region at the surface of the fin.

In some embodiments, the counter doping can be achieved by a low energy and/or pressure plasma doping ("PD" or "PLAD"). Contacting the fin surface with a plasma including dopant ions can also be an effective means of conformal surface doping. Example plasmas include $B_2Cl_3$ or $BF_3$ at a low pressure for conformal doping in a p-channel (or p-type) FinFET.

The angled halo implant can be combined with fluorine doping (F-doping) to create band barriers to reduce point defects and to tailor and maintain the doping profile during subsequent annealing. F-doping can prevent extended lateral diffusion toward the center of the fin body, which can lead to more random dopant fluctuation (RDF) and affect device mismatch. In the planar technology (Liu et al., op cit.), F-doping can provide a super-sharp halo profile and reduce halo dopant migration by reducing halo dopant diffusivity. The same advantage can be extended to halo doping for FinFETs by creating band barriers using angled ion implantation of F ions at the edges of the halo-doped regions (the edges away from the source and drain contacts).

In some embodiments, for effective source/drain doping, p-type doping at high dopant concentration can be performed using low pressure plasma doping with suitable precursor gases. For example, $B_2H_6$/He can be used for p-type S/D junction doping, and Ar/$AsH_3$ can be used for n-type S/D junction doping, using in situ doping during SiGe epitaxial growth. Relatively high percentages of Ge (more than 50%) in the SiGe semiconductor are also found to be advantageous in achieving the desired maximum channel strain effect for p-channel FinFETs.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail so as not to unnecessarily obscure aspects of the present embodiments.

What is claimed is:

1. A method of making a FinFET comprising
   forming a fin on a substrate, wherein the fin has a height between 2 and 6 times its width, wherein the fin has a length defining a channel between source and drain ends, and wherein the fin comprises a lightly doped bulk semiconductor,
   forming a conformal region of counter-doped semiconductor in the fin surface at a dopant concentration approximately equal to that of the lightly doped bulk semiconductor, and
   forming halo-doped regions by angled ion implantation, wherein the halo-doped regions are located adjacent to the source and drain ends of the fin in semiconductor material used for source and drain connections and adjacent to a half of the fin closest to the substrate.

2. The method of claim 1, wherein the fin has a height of about four times its width.

3. The method of claim 1, further comprising forming energy band barriers at the edges of the halo-doped regions by angled ion implantation.

4. The method of claim 1, wherein the conformal region of counter-doped semiconductor is formed by a method comprising forming a self-assembled monolayer (SAM) comprising dopant atoms on the fin, and
   heating the SAM to break the molecular structure of the SAM and cause the dopant atoms to migrate into the surface of the fin.

5. The method of claim 4, further comprising
   forming an oxide layer on the SAM prior to the heating step, and
   removing the oxide layer after the heating step.

6. The method of claim 4, wherein the heating comprises rapid thermal annealing at a temperature of 950-1150° C.

7. The method of claim 1, wherein the conformal region of counter-doped semiconductor is formed by a method comprising
   contacting the top and sides of the fin with a plasma containing dopant ions.

8. The method of claim 1, wherein the conformal region of counter-doped semiconductor is formed by a method comprising
   forming a conformal oxide layer on the fin surface using atomic layer deposition, wherein the conformal oxide layer comprises dopant atoms,
   heating the conformal oxide layer to cause dopant atoms to migrate into the surface of the fin, and
   removing the conformal oxide layer.

9. A FinFET comprising
   a fin on a substrate, the fin having a height between two and six times its width, the fin having a length defining a channel between source and drain ends, and wherein the fin comprises a lightly doped semiconductor,
   a conformal layer of counter-doped semiconductor disposed on a top and both sides of the fin, and
   halo-doped regions disposed adjacent to the source and drain ends of the fin in semiconductor material used for source and drain connections and adjacent to a half of the fin closest to the substrate.

10. The FinFET of claim 9, wherein the fin has a height of about four times its width.

11. The FinFET of claim 9, further comprising band barriers disposed at the edges of the halo-doped regions.

12. The FinFET of claim 11, wherein the band barriers comprise fluorine.

13. The FinFET of claim 9, wherein
   the lightly doped semiconductor is n-doped,
   the counter-doped semiconductor is p-doped, and
   the halo-doped regions are n-doped.

14. The FinFET of claim 13, wherein the source and drain comprise p-doped SiGe.

15. The FinFET of claim 14, wherein the Ge fraction in the SiGe is greater than 50% by atomic fraction.

16. The FinFET of claim 9, wherein
   the lightly doped semiconductor in p-doped,
   the counter-doped semiconductor is n-doped, and
   the halo-doped regions are p-doped.

17. The FinFET of claim 16, wherein source and drain comprise n-doped Si and carbon.

18. The FinFET of claim 9, wherein the lightly doped semiconductor comprises Si.

* * * * *